(12) United States Patent
Xiao et al.

(10) Patent No.: US 11,302,463 B2
(45) Date of Patent: *Apr. 12, 2022

(54) ELECTRICALLY CONDUCTIVE PTC INK WITH DOUBLE SWITCHING TEMPERATURES AND APPLICATIONS THEREOF IN FLEXIBLE DOUBLE-SWITCHING HEATERS

(71) Applicant: LMS Consulting Group, LLC, Marion, OH (US)

(72) Inventors: Shuyong Xiao, St-Laurent (CA); Lee M. Sisler, Marion, OH (US); Richard C. Abbott, New Boston, NH (US)

(73) Assignee: LMS CONSULTING GROUP, LLC, Marion, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/128,150

(22) Filed: Dec. 20, 2020

(65) Prior Publication Data

US 2021/0134496 A1 May 6, 2021

Related U.S. Application Data

(60) Continuation-in-part of application No. 16/454,570, filed on Jun. 27, 2019, now Pat. No. 10,902,982, (Continued)

(51) Int. Cl.
*H01C 7/02* (2006.01)
*C09D 11/108* (2014.01)
(Continued)

(52) U.S. Cl.
CPC .......... *H01C 7/02* (2013.01); *A41D 13/0051* (2013.01); *C09D 11/037* (2013.01); *C09D 11/10* (2013.01); *C09D 11/104* (2013.01); *C09D 11/106* (2013.01); *C09D 11/107* (2013.01); *C09D 11/108* (2013.01); *C09D 11/52* (2013.01);
(Continued)

(58) Field of Classification Search
None
See application file for complete search history.

(56) References Cited

U.S. PATENT DOCUMENTS 4,668,857 A * 5/1987 Smuckler ............... H01C 7/027
219/549
5,166,658 A * 11/1992 Fang ....................... H01C 7/021
338/22 R
(Continued)

*Primary Examiner* — Katie L. Hammer
(74) *Attorney, Agent, or Firm* — Stratford Group Ltd.

(57) ABSTRACT

An article comprising a double-switching heater that comprises a double-switching PTC ink deposited on a flexible substrate to form one or more resistors. The double-switching PTC ink comprises a first resin and a second resin; the first resin provides a first PTC effect within a first temperature range (T1, T2); the second resin provides a second PTC effect within a second temperature range (T3, T4), where T3≥T2; the first resin has an NTC effect above the first temperature range; the second PTC effect is greater than the first PTC effect; and the second PTC effect overlaps with, and is greater than, the NTC effect of the first resin. The substrate can be either thermal polyurethane, nylon or a polyester blend.

20 Claims, 19 Drawing Sheets

Related U.S. Application Data which is a division of application No. 15/441,396, filed on Feb. 24, 2017, now Pat. No. 10,373,745, which is a continuation-in-part of application No. 15/143,524, filed on Apr. 30, 2016, now Pat. No. 10,077,372, which is a continuation-in-part of application No. 14/120,638, filed on Jun. 12, 2014, now abandoned, said application No. 15/441,396 is a continuation-in-part of application No. 14/120,638, filed on Jun. 12, 2014, now abandoned.

(60) Provisional application No. 62/389,396, filed on Feb. 24, 2016.

(51) Int. Cl.

| | | |
|---|---|---|
| *C09D 11/107* | (2014.01) | |
| *C09D 11/106* | (2014.01) | |
| *C09D 11/104* | (2014.01) | |
| *C09D 11/037* | (2014.01) | |
| *H05B 3/12* | (2006.01) | |
| *F25C 1/22* | (2018.01) | |
| *A41D 13/005* | (2006.01) | |
| *E04C 2/52* | (2006.01) | |
| *C09D 11/10* | (2014.01) | |
| *H01L 49/02* | (2006.01) | |
| *H01C 7/04* | (2006.01) | |
| *C09D 11/52* | (2014.01) | |
| *F25C 5/08* | (2006.01) | |

(52) U.S. Cl.
CPC ............. *E04C 2/525* (2013.01); *F25C 1/22* (2013.01); *H01C 7/027* (2013.01); *H01C 7/028* (2013.01); *H01C 7/04* (2013.01); *H01L 28/20* (2013.01); *H05B 3/12* (2013.01); *F25C 5/08* (2013.01); *H05B 2203/017* (2013.01); *H05B 2203/019* (2013.01); *H05B 2203/02* (2013.01); *H05B 2203/026* (2013.01)

(56) References Cited

U.S. PATENT DOCUMENTS

| | | | | |
|---|---|---|---|---|
| 5,181,006 | A * | 1/1993 | Shafe | H01C 7/027 219/219 |
| 5,993,698 | A * | 11/1999 | Frentzel | H01C 7/028 252/511 |
| 10,373,745 | B2 * | 8/2019 | Xiao | H01C 7/028 |
| 10,902,982 | B2 * | 1/2021 | Xiao | C09D 11/108 |
| 2011/0263781 | A1 * | 10/2011 | Arancio | H05B 3/12 524/504 |
| 2016/0270152 | A1 * | 9/2016 | Duce | B60N 2/5685 |

* cited by examiner

ELECTRICALLY CONDUCTIVE PTC INK WITH DOUBLE SWITCHING TEMPERATURES AND APPLICATIONS THEREOF IN FLEXIBLE DOUBLE-SWITCHING HEATERS

CROSS-REFERENCE TO RELATED APPLICATIONS

This application is a continuation-in-part of U.S. patent application Ser. No. 16/454,570, filed Jun. 27, 2019, now allowed, which is a divisional of U.S. patent application Ser. No. 15/441,396, filed Feb. 24, 2017, now allowed, which is a continuation-in-part of U.S. patent application Ser. No. 15/143,524, filed Apr. 30, 2016, now U.S. Pat. No. 10,077,372, which is a continuation-in-part of U.S. patent application Ser. No. 14/120,638, filed Jun. 12, 2014, and which claims the benefit of U.S. Provisional Application No. 62/389,396, filed Feb. 24, 2016, each of which is hereby incorporated by reference herein in its entirety.

U.S. patent application Ser. No. 15/441,396, filed Feb. 24, 2017, is also a continuation-in-part of U.S. patent application Ser. No. 14/120,638, filed Jun. 12, 2014, and claims the benefit of U.S. Provisional Application No. 62/389,396, filed Feb. 24, 2016, each of which is hereby incorporated by reference herein in its entirety.

TECHNICAL FIELD

The present invention is directed to an electrically conductive ink and relates to a method of making a PTC screen printable ink with double switching temperatures and applications thereof in flexible, screen-printable polymeric PTC heaters.

SUMMARY OF THE INVENTION

In one aspect, the present invention related to a double-switching heater comprising a double-switching PTC ink deposited on a substrate to form one or more resistors, the double-switching PTC ink having a first resin that provides a first PTC effect at a first temperature range and a second resin that provides a second PTC effect at a second temperature range, wherein the second temperature range is higher than the first temperature range.

In some embodiments, the substrate is a flexible substrate. In some embodiments the substrate is a rigid substrate. In some embodiment, the substrate is deformable to generate a three-dimensional structure.

In some embodiments, the substrate is selected from the group consisting of: polyester, polyimide, polyamide, polypropylene, thermoplastic polyurethane, fiberglass, cement board, carbon composite materials, polyethylene terephthalate, polyethylene, aluminum, steel, glass composite, molded plastic, high-density polyethylene and styrene ethylene butylene styrene.

In some embodiments, the first resin is selected from the group consisting of: polyethylene glycol and polycaprolactone and the first temperature range is from 20° C. to 35° C.

In some embodiments, the first resin is selected from the group consisting of: polycaprolactone diol and ethylene-vinyl acetate copolymer and the first temperature range is from 36° C. to 50° C.

In some embodiments, the first resin is selected from the group consisting of: low-density polyethylene and maleic acid grafted polyvinyl chloride and the first temperature range is from 51° C. to 70° C.

In some embodiments, the second resin is selected from the group consisting of: polyvinylidene fluoride, poly vinyl chloride, high-density polyethylene, and polyacrylate compounds and the second temperature range is from 70° C. to 160° C.

In some embodiments, the heater is encapsulated by an encapsulation material. In some embodiments, the encapsulation material is selected from the group consisting of: polyester, polyimide, polypropylene, rubber, silicone, thermoplastic polyurethane, laminates, ethylene-vinyl acetate (EVA) adhesive film, acrylate adhesive film and silicon adhesive film, fabric, silicone, and polyethylene terephthalate (PET).

In some embodiments, the heater demonstrates temperature fluctuations of 5 degrees at an operating temperature of 48° C.

In some embodiments, the heater demonstrates temperature fluctuations of 2 degrees at an operating temperature above 48° C.

In some embodiments, the heater demonstrates substantially no degradation in relative resistance over multiple operating cycles.

In some embodiments, the heater includes a plurality of resistors in parallel. In some embodiments, the heater includes electrical interconnects comprising one or more of: metal paste, metal foils, alloys, aluminum, copper, nickel and high-conductivity electronic polymers.

In some embodiments, the heater includes a sensor positioned proximal to the heater and a feedback loop to regulate operating temperature.

In another aspect the present invention is directed to a radiant-heated flooring material comprising a double-switching heater comprising a double-switching PTC ink deposited on a substrate to form one or more resistors, the double-switching PTC ink having a first resin that provides a first PTC effect at a first temperature range and a second resin that provides a second PTC effect at a second temperature range, wherein the second temperature range is higher than the first temperature range, wherein the double-switching heater is disposed between a flooring material and a sub-flooring material.

In another aspect, the present invention is directed to a flooring textile comprising a double-switching heater comprising a double-switching PTC ink deposited on a substrate to form one or more resistors, the double-switching PTC ink having a first resin that provides a first PTC effect at a first temperature range and a second resin that provides a second PTC effect at a second temperature range, wherein the second temperature range is higher than the first temperature range, wherein the double-switching heater is bonded to the underside of the flooring textile.

In another aspect, the present invention is directed to a fluid pipe comprising a double-switching heater comprising a double-switching PTC ink deposited on a substrate to form one or more resistors, the double-switching PTC ink having a first resin that provides a first PTC effect at a first temperature range and a second resin that provides a second PTC effect at a second temperature range, wherein the second temperature range is higher than the first temperature range.

In some embodiments, the heater is disposed on the inside of the fluid pipe. In some embodiments, the heater is disposed on the outside of the fluid pipe.

In another aspect, the present invention is directed to a mold comprising a double-switching heater comprising a double-switching PTC ink deposited on a substrate to form one or more resistors, the double-switching PTC ink having a first resin that provides a first PTC effect at a first temperature range and a second resin that provides a second PTC effect at a second temperature range, wherein the second temperature range is higher than the first temperature range, wherein the heater is disposed on the proximal to a cavity of the mold.

In another aspect, the present invention is directed to an ice cube tray comprising a double-switching heater comprising a double-switching PTC ink deposited on a substrate to form one or more resistors, the double-switching PTC ink having a first resin that provides a first PTC effect at a first temperature range and a second resin that provides a second PTC effect at a second temperature range, wherein the second temperature range is higher than the first temperature range.

In another aspect, the present invention is directed to a cooking appliance comprising a double-switching heater comprising a double-switching PTC ink deposited on a substrate to form one or more resistors, the double-switching PTC ink having a first resin that provides a first PTC effect at a first temperature range and a second resin that provides a second PTC effect at a second temperature range, wherein the second temperature range is higher than the first temperature range.

In another aspect, the present invention is directed to an article of clothing comprising a double-switching heater comprising a double-switching PTC ink deposited on a substrate to form one or more resistors, the double-switching PTC ink having a first resin that provides a first PTC effect at a first temperature range and a second resin that provides a second PTC effect at a second temperature range, wherein the second temperature range is higher than the first temperature range.

In another aspect, there is provided a heating composite comprising an encapsulated double-switching heater disposed between a first material and a second material, wherein the double-switching heater may comprise: a double-switching PTC ink deposited on a substrate to form one or more resistors, the double-switching PTC ink comprising a first resin and a second resin, wherein: the first resin can provide a first PTC effect within a first temperature range $(T_1, T_2)$; the second resin can provide a second PTC effect within a second temperature range $(T_3, T_4)$, where $T_3 \geq T_2$; the first resin has an NTC effect above the first temperature range; the second PTC effect is greater than the first PTC effect; and the second PTC effect overlaps with, and is greater than, the NTC effect of the first resin.

The substrate may be selected from the group consisting of: polyimide, polypropylene, polyethylene terephthalate, polyethylene, polyurethane, glass fiber and silicone.

The first resin can be crystalline or semi-crystalline; and the second resin can be non-crystalline. The second resin may be selected from the group consisting of: polyvinylidene fluoride, polyvinyl chloride, high-density polyethylene, and polyacrylate compounds and the second temperature range can be from 70° C. to 160° C.; and/or the first resin may be selected from: the group consisting of: polyethylene glycol and polycaprolactone and the first temperature range can be from 20° C. to 35° C.; or the group consisting of: polycaprolactone diol and ethylene-vinyl acetate copolymer and the first temperature range may be from 36° C. to 50° C.; or the group consisting of: low-density polyethylene and maleic acid grafted polyvinyl chloride and the first temperature range may be from 51° C. to 70° C.

Furthermore, the resistance magnification at a switching temperature of the heater can be between 15 and 250, while the switching temperature of the heater may be between 30° C. and 160° C.

The double-switching heater can be encapsulated in an encapsulation material selected from the group consisting of: polyester, polyimide, polypropylene, rubber, silicone, thermoplastic polyurethane, laminates, ethylene-vinyl acetate (EVA) adhesive film, acrylate adhesive film, polytetrafluoroethylene (PTFE) adhesive film, silicone adhesive film, fabric, silicone, and polyethylene terephthalate (PET).

In addition, the first material can be selected from the group consisting of tiles, wood, cement, asphalt, stone, laminate, carpet, vinyl flooring, wallpaper, ceiling tiles, gypsum, plaster, stucco, fiber, metal, roofing tiles and decorative panels. The second material may be selected from the group consisting of wood, cement, asphalt, stone, cement board, wall board, gypsum, plaster, ethylene propylene diene monomer (EPDM) rubber, roofing underlayment and ceiling tile.

The encapsulated double-switching heater can be attached to at least one of the first material and the second material by an adhesive and/or one or more fasteners.

In addition, a ground plane may be placed between the encapsulated double-switching heater and the second material. The ground plane can be attached to an outside surface of the encapsulated double-switching heater by an adhesive or fastener.

Furthermore, a thermal barrier may be placed between the encapsulated double-switching heater and the second material. The thermal barrier may be inserted in a rigid form or attached to a flexible form of the encapsulated double-switching heater.

In addition, the double-switching heater can comprise a plurality of resistive elements, and each individual resistive element is regulated independently for delivery of heating power.

The encapsulated double-switching heater may be perforated and embedded in the second material, and the perforated double-switching heater can be overlaid with a strengthening medium. The strengthening medium can be a fiberglass mat, polyamide mesh, or glass fiber mesh. The strengthening medium may be overlaid with a layer of cement that is cured. In addition, the substrate may comprise a mat used to strengthen cement board, and the double-switching PTC ink can be screen printed onto the mat.

The encapsulated double-switch heater may be embedded within a polymeric material, rubber or silicone. It can be attached to an underside of a flooring textile and may be placed over an underlay of the flooring textile. The flooring textile may be a carpet or a rug.

The encapsulated double-switching heater may be encapsulated with rubber, fabric, silicone or polyurethane; the first material can comprise a thermal barrier, and the second material can comprise concrete, asphalt, sand and/or gravel. The first material may be rubber or a polymer. Furthermore, the encapsulated double-switching heater can be bonded to a perforated polymeric sheet.

The encapsulated double-switching heater may be encapsulated with rubber, fabric, silicone or polyurethane, with an adhesive attached to a first surface of the encapsulated double-switching heater; and/or a thermal insulation barrier attached to a second surface of the double-switching heater.

BACKGROUND

The terms positive temperature coefficient (PTC) materials and, positive temperature coefficient of resistivity (PTCR) materials, as used herein, refer to materials that increase in electrical resistance when their temperature is raised. Polymers can be made electrically conductive by dispersing suitable amounts of conductive particles such as carbon black or fine metal particles. Polymeric compositions exhibiting positive temperature coefficient (PTC) behavior and devices incorporating the same have been used in many applications, especially in electronic industries, including uses as constant temperature heaters, over current regulators, and low-power circuit protectors. A typical use in a circuit is limitation of current, which is controlled by the temperature of a PTC element forming part of the circuit.

There are two major ways to produce such PTC compositions, the one is melt-extruding technology and the other is ink/coating technology. The melt-extruding technology is most popularly applied but the resulting articles may be inflexible and are generally unsuitable for configuration into the intricate or very thin shapes often desirable for use on flexible substrates or printed circuit boards. Over recent years, there has been particular interest in the ink/coating technology to produce polymeric PTC compositions. Reference may be made, for example, to U.S. Pat. Nos. 4,628,187, 5,181,006, 5,344,591, and 5,714,096, and Japanese Patent Publication Nos. 2008293672, 2009151976, and 2009199794. For these inks/coatings, the polymer resins, which are dissolved in suitable solvents, are the binders and the conductive particles are dispersed in the binders to obtain the inks/coatings. Various polymeric PTC compositions have been developed, however, most PTC compositions exhibit Negative Temperature Coefficient (NTC) characteristics of resistivity immediately after the PTC characteristics. This change from PTC behaviour to a strong NTC behaviour is often undesirable, and may cause self-burning in some cases. FIG. 1 shows a typical curve of the PTC composition described above. It indicates that when the temperature T, plotted on a horizontal axis, is in excess of 70° C., the PTC ratio $R_T/R_{25}$ is reduced, PTC ratio being a ratio between a resistance $R_T$ at a certain temperature T and a resistance $R_{25}$ at a temperature of 25° C. The lower resistance leads to excessive current flow and the heating element is overpowered. Therefore, the NTC temperature region is a potential safety risk temperature region.

Efforts have been undertaken to reduce or eliminate the NTC effect. As disclosed in U.S. Pat. No. 5,227,946 and European Patent EP 0311142, reduction of the NTC effect in polymeric PTC compositions has been achieved by cross-linking the material. Most effective is post-cross linking after the forming step either by gamma radiation or accelerated electrons. Cross-linking in the melt also erases the NTC effect but negatively affects the PTC amplitude. In addition, the step of cross-linking the material increases the time and production costs for manufacturing the PTC composition.

U.S. Pat. No. 8,496,854 discloses a method to reduce the NTC effect without cross-linking the material. Their PTC compositions include a thermoplastic base resin, an electrically conductive filler and particles of a polymeric additive dispersed in the PTC composition; wherein the polymeric additive has a melting or softening temperature greater than the melting temperature of the thermoplastic resin, which helps reduce the NTC effect. The above PTC composition was produced by melt-extruding technology not like the ink/coating technology used in the present invention. In addition, the NTC effect is only reduced and not completely eliminated by the above method.

PTC materials are commonly used in a class of flexible heaters comprising an electrical resistor that is encapsulated between two polymer films. The resistor is typically an etched metal foil or, alternatively, an electrically conductive material, or ink, with fixed resistance and suitable properties for printing onto the polymer film. The foil is usually composed of Ni—Cr alloy; the ink is usually composed of an electrically insulating polymer with a dispersed, electrically conductive powder additive. The conductive powder can be composed of metals such as Ag, Au or Sn, electro-conductive ceramics such as WC, or carbon in various forms such as graphite or carbon black. Carbon is the most common. The powder additive, dispersed three-dimensionally throughout the polymer, has sufficient volume fraction in the polymer to reach its percolation threshold so as to form a contiguous, conductive network for electrical current to flow throughout the polymer. Both flexible heater types often have an adhesive on at least one outer side of the encapsulating film for affixing the heater to the part to be heated.

Polymeric PTC heaters form a subclass of the second type of flexible heaters described above. These flexible heaters are typically encapsulated in a polymer film like other heaters of the type and generate heat with an applied voltage, but have printed conductive polymer elements that can control current, hence control heating power. The temperature at which the electrical resistance starts to increase sharply is referred to as the switch temperature. A "switch temperature" or "switching temperature" as used herein refers to the temperature at which the PTC heater generates power only sufficient to maintain thermal equilibrium with its environment, i.e. the point at which the heater temperature neither rises nor lowers under its own power. Typical resistance magnification factors range from 5-15 at the switch temperature. Therefore, they are self-regulating. The switching mechanism is due to the polymer undergoing a phase change at around the switch temperature from its normal crystalline molecular structure to an amorphous molecular structure. Because the amorphous material phase has greater volume than the crystalline phase, its volume and thermal expansion interrupts the web of conductors dispersed throughout the polymer. Upon cooling below the switch temperature, the reverse phase-transformation takes place and the conductive network is re-established.

Polymeric PTC flexible heaters are used for a wide variety of applications where low temperature, controlled thermal gradients, uniform heating and localized temperature control are crucial, without requiring complex electronic controllers or feedback loops. PTC-based heater solutions can be found in many aspects of daily life from automotive applications (such as external mirror heaters, seat heaters, etc.), to structural home systems (including floor heaters, bed heaters, etc.) to small appliances (like rice or vegetable cookers).

Polymeric PTC flexible heaters are most commonly composed of a polymer with carbonaceous conductor in the form of carbon black or graphite. This is because polymeric PTC heaters with metal or conductive ceramics are more expensive and more difficult to deposit as films. However, carbon based polymeric PTC heaters suffer from several important operational technical problems.

One such problem is a low resistance magnification at the switch temperature, typically ranging from 5-15. This results in some power dissipation even at maximum resistance.

Another problem is the transition temperature region between the low resistance state and the high resistance state where only partial current flows. The transition region varies in width proportional to ambient temperature and the overall conditions for heat transfer. Therefore, the operational characteristics of the heater are determined by a multitude of design factors involving its physical environment. This affects the heater's power dissipation, the time-to-switch and the heater's hold current.

Another problem is that many PTC heaters exhibit resistance hysteresis when switched. This is observed as an increase in resistance from the starting resistance even hours after the switch event. Over time, the original resistance is approached but it may be days, months or years. Fortunately, the resistance is not cumulative over subsequent switch events so strategies can be taken to account for it.

Yet another problem is the heater's resistance recovery time after a reset event. The time is usually one to two minutes but can be longer depending on the heat transfer environment of the heater and its material design.

Still another problem and one that jeopardizes safety of the heaters is a strong NTC effect that most PTC materials exhibit at temperatures slightly above the temperature at which the strong PTC effect takes hold. The NTC effect causes a dramatic increase in current flow resulting in possible catastrophic failure of the component. This effect is quite problematic for applications of flexible PTC heaters because it can destroy the heater and even cause a fire.

The present invention provides a method to completely eliminate the NTC effect of the PTC composition produced by ink/coating technology.

SUMMARY OF THE INVENTION

The present invention provides a PTC ink composition, which is screen printable and has a high PTC characteristic without any NTC behaviour. The safety risk temperature region in the application of the PTC composition has been completely eliminated. There is only one kind of polymer as the vehicle in most polymeric PTC compositions. When the temperature is above the melting point ($T_m$) or softening point ($T_s$) of the polymer, the polymeric PTC composition will turn unstable, which usually results in the NTC behaviour. In the polymeric PTC composition of the present invention, two kinds of polymer with different $T_m$ or $T_s$ are used. The first kind of polymer with a lower $T_m$ or $T_s$ results in the first PTC effect in the working temperature region, and the second kind of polymer with higher $T_m$ or $T_s$ results in the second PTC effect in the safety risk temperature region. Therefore, the present PTC composition is also called a PTC screen printable ink with double switch temperatures.

In another aspect, the present invention describes applications of flexible PTC heaters that utilize the novel composition of PTC conductive ink described above that eliminate the NTC effect, offer magnification factors as high as 250 and switch in the range of 30°-160° C. Applications using this technology therefore are safer, more reliable and dissipate minimal power at switch temperature.

Figure 1:
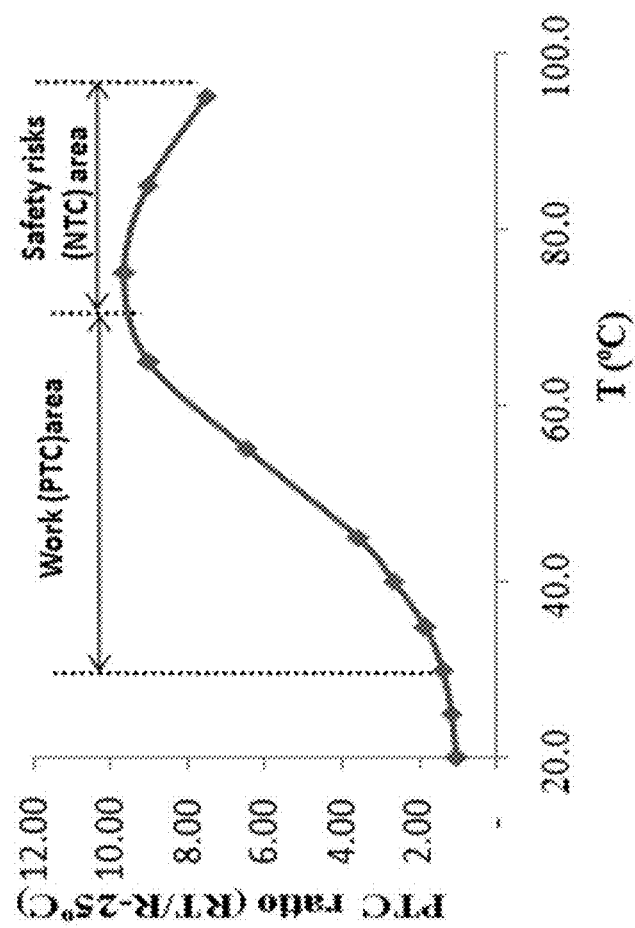
FIG. 1 presents a typical temperature-resistance curve of a typical prior art PTC composition.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION OF THE INVENTION

The present invention provides an electrically conductive PTC screen-printable ink with double switch temperatures and a method of making the same. The electrically conductive PTC ink not only presents an efficient PTC effect at lower temperatures but also shows a PTC effect at higher temperatures. When the present PTC ink is applied in a self-regulating heating element with low regulated temperatures (<70° C.), the safety risk temperature region is completely eliminated.

The PTC ink with double switching temperatures is a typical screen-printable ink produced by ink/coating technology, which comprises:
(1) 10-30 wt % conductive particles;
(2) 5-15 wt % polymer resin 1;
(3) 5-15 wt % polymer resin 2;
(4) 40-80 wt % organic solvent;
(5) 1-5 wt % other additives The conductive particles can be one or a mixture of more than one of metallic powder, metal oxide, carbon black and graphite.

The polymer resin 1 is a crystalline or semi-crystalline polymer, such as, but not limited to, polyurethane, nylon, and polyester.

The polymer resin 2 is a non-crystalline polymer, such as, but not limited to, acrylic resin.

The selection of the solvent is based on its boiling point at STP and the solubility of polymer resins used. The polymer resin 1 and resin 2 are completely dissolved in the organic vehicle prior to blending with other components. Any organic, inert liquid may be used as the solvent for the medium (vehicle) so long as the polymer is fully solubilized. The preferred solvents are selected from Methyl Ethyl Ketone ("MEK"), N-methyl pyrolidone (NMP), toluene, xylene, and the like. The other additives include a dispersing/wetting additive and a rheology additive.

Specifically, this invention discloses an ink composition having two distinct positive temperature coefficient (PTC) characteristics at two different temperature ranges, comprising:

a) 5-15 wt % thermally active polymer resin-1 having a melting point of 30-70° C. and providing the first PTC characteristic in the lower temperature range below 70° C.; preferably being a crystalline polymer or a semi-crystalline polymer.

b) 5-15 wt % thermally active polymer resin-2 having a melting point of 70-140° C. and providing the second PTC characteristic in the higher temperature range above 70° C.; preferably being a non-crystalline polymer c) 10-30 wt % carbon black.

d) 40-80 wt % organic solvent having a boiling point higher than 100° C. and capable to dissolve both the polymer resin-1 and polymer resin-2.

e) 0-5 wt % additives of enhanced dispersing/wetting and rheology properties.

The invented PTC ink is preferably prepared according to the following steps. 1) The preparation of 10-30 wt. % polymer solution. For example, 80.0 grams of N-methyl pyrolidone is firstly heated to 80° C. and then 10.0 grams of polyurethane and 10.0 grams of poly(methyl methacrylate) are added slowly into the system. The mixture is heated at 80° C. for 8 hours, yielding a homogenous solution. 2) The preparation of ink base. A dispersing additive 1.0-10.0 wt. % based on the total ink base is firstly added into the above polymer solution under mechanically stirring. Then, the carbon black 30-60 wt. % based on the total ink base is added slowly into the solution under mechanically stirring. This mixture is then subjected to a three-roll mill to assure proper dispersion of the carbon black to form a paste-like ink base. During the three-roll milling, a rheology additive 1.0-10.0 wt. % based on the total ink base may be added to enhance the screen-printing properties of the ink base. 3) The preparation of final PTC ink composition. The final PTC ink can be obtained by mechanically mixing the above polymer solution and ink base at ratios ranging from 0.5/1 to 1/1. The ratios depend on the needs of the application design such as the desired starting resistance.

The resulting PTC ink is applied to substrates such as polyester films (e.g. DuPont Teijin films) by the screen-printing process. After printing the PTC ink on a polyester film, it is cured in an oven at 120° C. for 10 minutes. In other instances, the film may be cured at different temperatures. Subsequently, a conductive paste, such as DuPont 5025 silver paste, suitable for use on polyester substrates is printed over edges of the PTC ink and cured at 120° C. for 5 minutes. The cured PTC film is tested for resistance change with temperature.

Flexible Double-Switching Heaters

In some embodiments, the double-switching PTC ink of the present invention may be deposited on a film or other substrate to create a flexible heater comprising the double-switching PTC ink deposited on the film (or other substrate). The term "flexible double-switching heater" as used hereinafter refers to a film or other substrate with the double-switching PTC ink deposited on the film (or other substrate). Depending on the specific application of a flexible double-switching heater, different substrates may be used to generate flexible double-switching heaters with different thermal stability properties. For example, in some instances, the polyester substrate described above may be used to generate a flexible double-switching heater. In other applications which require a higher operating temperate (e.g. an operating temperature around or above 100° C.), a polyimide (e.g. DuPont Kapton) or polyamide substrate may be used.

Similarly, various substrates may be used depending on other application-dependent parameters, such as toxicity. For example, in certain applications food-grade substrates such as polypropylene may be used; for clothing, where low weight and flexibility is required, thermoplastic polyurethane (TPU) or fabric itself such as polyester blend or nylon is appropriate; for high tensile strength applications such as fiberglass reinforced cement board or carbon composite materials, the strengthening medium, e.g. fiberglass mat, would be used. Other substrates can include but are not limited to: polyethylene terephthalate (PET), polyethylene (PE), aluminum, steel, glass composite, molded plastic, high-density polyethylene (HDPE) and styrene ethylene butylene styrene (SEBS).

In some instances, the flexible-double switching heater will have a top film positioned over the substrate. Suitable materials for a top film include materials suitable for use as a substrate. However, the top film may be composed of a different material than the substrate.

Depending on the embodiment, the double-switching PTC ink of the present invention may be deposited on the substrate to generate a flexible double-switching heater using various techniques. As discussed above, one of the favorable properties of the double-switching PTC ink is that its dispersion allows for screen printing onto a substrate. In addition, the double-switching PTC ink can be deposited on the substrate using gravure or rotogravure (e.g. "doctor blade") techniques. The ink may also be dispensed over simple or complex surfaces using nozzles mounted on programmable robots or embedded in components by 3-D printing. Other methods of depositing PTC ink with substantial accuracy are known in the art.

As discussed above, once the double-switching PTC ink has been deposited on a substrate, silver paste may be deposited on the substrate to create electrical interconnects (e.g. contacts and bus lines) for use in flexible double-switching heater applications. In some embodiments, other metals (e.g. metal foils or pastes), alloys or electrically conductive materials such as, but not limited to, aluminum, copper, nickel and alloys thereof, or high conductivity electronic polymers may be deposited on the substrate to create interconnects. As discussed above, metal foils, inserted or laminated, may also be used to create electrical interconnects.

In some applications, the flexible double-switching heater may also be encapsulated with a layer of encapsulation material identical to or different from the substrate used to fabricate the PTC film. Depending on the embodiment, the flexible double-switching heater may be fully or only partially encapsulated. Suitable encapsulation materials include, but are not limited to: polyester, polyimide, polypropylene, rubber, silicone, thermoplastic polyurethane, laminates, ethylene-vinyl acetate (EVA) adhesive film, acrylate adhesive film and silicon adhesive film, fabric, silicone, and polyethylene terephthalate (PET).

Additionally, one or both of the layers of encapsulation material may have other layers of materials bonded to it such as, but not limited to: materials suitable for use as encapsulation materials, adhesive films, thermal barriers, reflective films, high or low emissivity films, absorptive films, alkaline resistant films, ground planes or EMI/RFI protective layers.

In various applications, the PTC film may be flexible, semi-rigid and/or rigid. In addition, the PTC film may be deformed (e.g. by heating the PTC film) and shaped into a three-dimensional shape. In various application, the flexible double-switching heater may be positioned proximal to a sensor and may use a feedback loop to adjust its temperature based on the sensor.

Depending on the embodiment and the type of materials used in making the double-switching PTC ink, the flexible double-switching heater may have different PTC effects at different temperate ranges. For example, the switching temperature of the first PTC effect (i.e. the PTC effect of the two PTC effects that has a lower temperature range) can range from 30° C.-70° C. Suitable compounds for use as polymer resin-1 to achieve a first PTC effect at lower temperatures (e.g. from 20° C. to 35° C.) include: polyethylene glycol (PEG) and polycaprolactone. Suitable compounds for use as polymer resin 1 to achieve a first PTC effect at mid-range temperatures (e.g. from 36° C. to 50° C.) include polycaprolactone diol and ethylene-vinyl acetate copolymer such as Elvax 265 (Du Pont Product). Suitable compounds for use as polymer resin 1 to achieve a PTC effect at high temperatures (e.g. from 51° C. to 70° C.) include low-density polyethylene (LDPE) and maleic acid grafted polyvinyl chloride (PVC).

Depending on the polymer resin-1 used, a polymer resin-2 may be selected to provide a second PTC effect that is higher than the first PTC effect, thereby eliminating material degradation due to NTC effect. Suitable compounds for use as polymer resin-2 include: polyvinylidene fluoride, poly vinyl chloride (PVC), high-density polyethylene (HDPE), and a variety of polyacrylate compounds. The second PTC effect of the second compound can range from 70° C. to 160° C.

As discussed below with respect to Example 5, the flexible double-switching heaters of the present invention provide various beneficial characteristics such as self-regulation of temperature. As discussed with respect to Example 5, the flexible double-switching heaters of the present invention demonstrate substantial temperature equilibrium (plus or minus 5° C.) at an operating temperature of approximately 48° C. At temperatures greater than 48° C., the flexible double-switching heaters demonstrate minor temperature fluctuations (plus or minus 2° C.).

Similarly, as discussed below with respect to Example 6, the flexible double-switching heaters of the present invention demonstrate durability due to the second PTC effect. Specifically, the flexible double-switching heaters of the present invention demonstrate a negligible reduction in their relative resistance (approximately 1%) over multiple operating cycles with an operating temperature of 65° C.

Radiant Heating Applications.

Figure 2A:
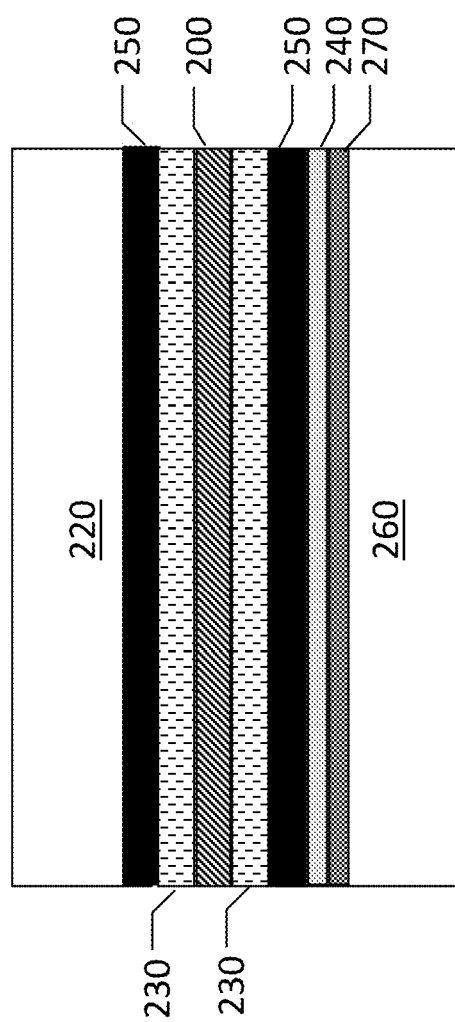
FIG. 2a is a cross sectional view of a flexible double-switching heater used in a radiant-heating application according to one embodiment of the present invention.

Flexible double-switching heaters may be used for radiant heated floors, walls and ceilings. FIG. 2a depicts a specific embodiment of a flexible double-switching heater 200 used in a radiant-heated floor or ceiling application. As discussed above, the flexible double-switching heater 200 comprises a PTC film including PTC ink of the present invention printed on a substrate. Suitable substrates for radiant-heated floor applications include: polyethylene terephthalate (PET), polypropylene (PP), polyethylene (PE) and polyimide (PI).

The flexible double-switching heater 200 shown in FIG. 2a is encapsulated in an encapsulation material 230. Suitable encapsulation materials for use in this application include: laminates, ethylene-vinyl acetate (EVA) adhesive film, acrylate adhesive film and silicone adhesive film. The encapsulated heater 200 may have an additional material (not shown) added to the outside of the heater.

As depicted in FIG. 2a, the encapsulated flexible double-switching heater 200 is inserted between flooring/ceiling materials 220 and sub-flooring/ceiling materials 260. Suitable types of flooring/ceiling materials 220 used in this application include, but are not limited to: tiles, hardwood, cement, laminate, carpet, vinyl flooring, wallpaper, ceiling tiles or other decorative material. Suitable types of sub-flooring/ceiling materials 260 include: flooring underlay, wallboard or ceiling material such as, but not limited to, plywood, cement, cement board, wall board or ceiling tile. Depending on the embodiment, the encapsulated flexible double-switching heater 200 may be attached to the sub-flooring/ceiling materials 260 and/or the flooring/ceiling materials 220 using any kind of attachment material 250. Suitable attachment materials 250 include adhesives (e.g. thinset) and/or mechanical fasteners.

In various embodiments, a ground plane 240 and/or thermal barrier may be optionally placed between the encapsulated flexible double-switching heater 200 and the sub-flooring/ceiling materials 260. For example, a ground plane 240 may be required for leakage current monitoring or safety purposes and/or a thermal barrier 270 may be required for greater efficiency. In a specific embodiment, the ground plane 240 may be laminated or attached using pressure sensitive adhesive to the outside surface of the encapsulated flexible double-switching heater 200. In a specific embodiment, a thermal barrier 270 may be inserted in rigid form or attached to the encapsulated flexible double-switching heater 200 using adhesives or fasteners.

Figure 2B:
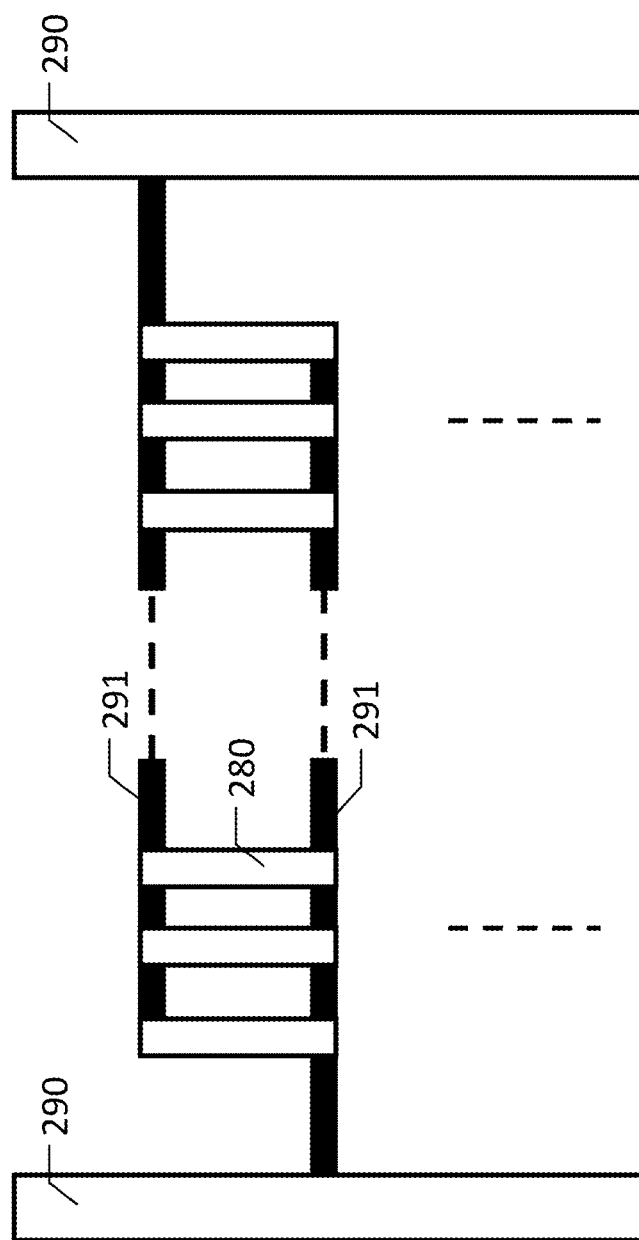
FIG. 2b is a circuit according to one embodiment of the present invention.

FIG. 2b depicts a printed circuit that regulates temperature independently over each small area covered by the individual resistor 290. Each resistor in a row is powered by line voltage busses 290 and interconnects 291. Because the flexible double-switching heater 200 material typically has high sheet resistivity, power, P, is determined by arranging printed resistors in parallel and in rows on the substrate using the double-switching PTC ink of the present invention. Since power of a row is $P_{row}=V^2/R_{row}$ where V is the applied voltage and $R_{row}$ is the total resistance in the row, the number of resistors arranged in a row, n, which make up the total resistance in a row by R/n determines the total power developed in that row. R is the resistance of an individual resistor. By making the resistors small (0.2 cm-10 cm) and arranging them in N rows as depicted in FIG. 2b, the power is defined and the temperature at each resistor is independently regulated. The total Power is then written as $P=nNV^2/R$. This circuit pattern allows independent temperature control of small areas and temperature uniformity over the surface of the heater regardless of the local thermal load. The gap between discrete resistors may also be reduced to zero to form a contiguous line of resistor with identical behavior of the heater, i.e. local self-regulation in response to local thermal load conditions.

Figure 3:
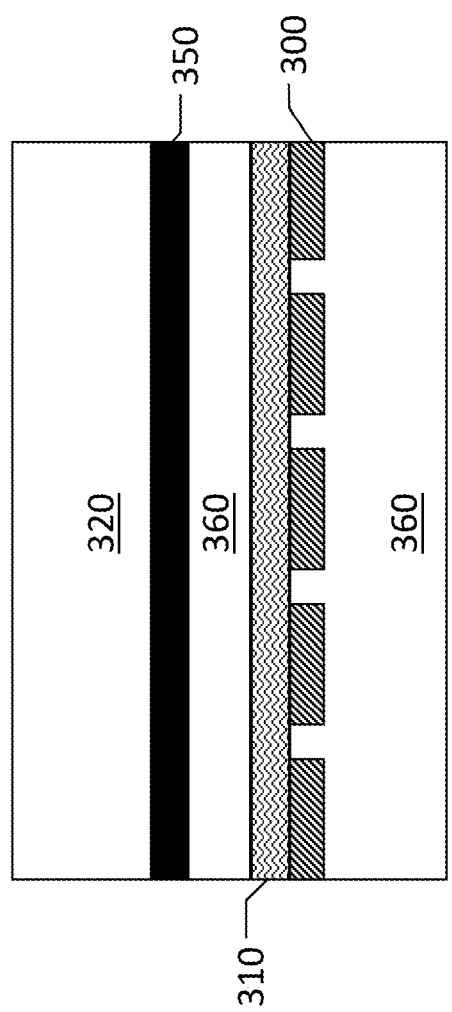
FIG. 3 is a cross sectional view of a flexible double-switching heater used in a radiant-heating application according to one embodiment of the present invention.

FIG. 3 depicts another specific embodiment of a radiant-heated floor/ceiling application of a flexible double-switching heater 300. As shown in FIG. 3, the flexible double-switching heater 300 is positioned between flooring/ceiling materials 320 and sub-flooring/ceiling materials 360. In the specific embodiment depicted, the flexible double-switching heater 300 is embedded in the sub-flooring/ceiling materials 360. As shown in FIG. 3, the flexible double-switching heater 300 is perforated and bonded to a strengthening medium 310 by the sub-flooring/ceiling material 360. The perforations allow the sub-flooring/ceiling material 360 to penetrate the flexible double-switching heater 300 in order to anchor the strengthening medium 310 to the material 360. In this way, the heater 300, strengthening medium 310 and sub-flooring/ceiling material 360 become affixed to each other.

According to the embodiment, various strengthening mediums 310 may be used including but not limited to: fiberglass mats, polyamide mesh and glass fiber mesh. Suitable sub-flooring/ceiling materials 360 for used in this embodiment include: cement, cement board, plywood, composite wood products, and composite polymer products. Suitable flooring/ceiling materials 320 for use in this embodiment include: tile, laminate, hardwood, carpet, ceiling tile, plaster and/or other standard flooring/ceiling materials as known in the art.

In a specific embodiment, a perforated flexible double-switching heater 300 can be embedded in a sub-flooring/ceiling material 360 comprising cement and overlaid with a strengthening medium 310 comprising glass-fiber mesh. A layer of cement (not shown) was poured over the strengthening medium 310 and cured to bond the flexible double-switching heater 300, the sub-flooring/ceiling material 360 and the strengthening medium 310 to each other. In another specific embodiment, the perforated flexible double-switching heater 300 is embedded in a sub-flooring/ceiling material 360 comprising layers of plywood and laminated.

In another specific embodiment, the perforated flexible double-switching heater 300 was created using a substrate comprising a mat used to strengthen cement board (i.e. the double-switching PTC ink was screen printed onto the mat).

In the embodiment depicted in FIG. 3, the flexible double-switching heater 300 may be bonded to the underside of the flooring/ceiling material 320 using an attachment material 350 such as those described above with respect to FIG. 2.

Figure 4:
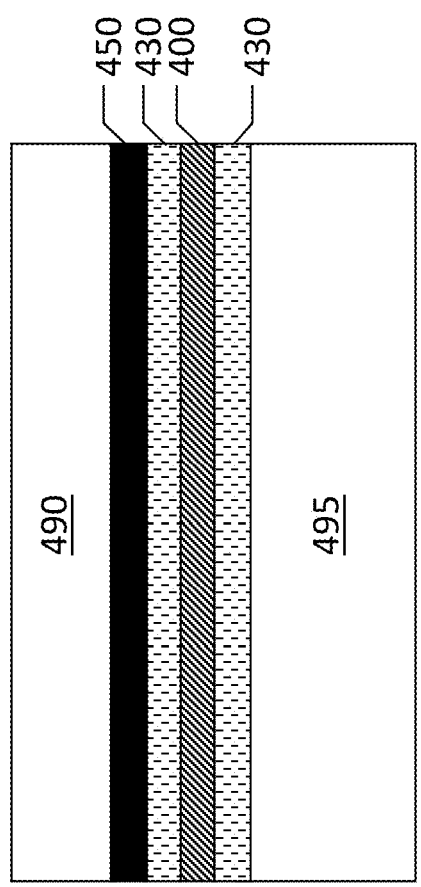
FIG. 4 a cross sectional view of a flexible double-switching heater used in a radiant-heating application according to one embodiment of the present invention.

FIG. 4 depicts another specific embodiment of a flexible double-switching heater in a radiant-heated floor/ceiling application. In the embodiment depicted in FIG. 4, the flexible double-switching heater 400 is encapsulated in an encapsulation material 430. Suitable encapsulation materials 430 include but are not limited to rubber, silicone, polyurethane or other polymers. In some embodiments, the encapsulation material 430 may include its own power supply.

In the specific embodiment depicted in FIG. 4, the encapsulated flexible double-switching heater 400 is bonded to the underside of a flooring textile 490 to form an integral heater. Exemplary flooring textiles include, but are not limited to, carpets and rugs. The encapsulated flexible double-switching heater 400 can be bonded to the flooring textile 490 using attachment materials 450. Suitable attachment materials for this embodiment include: a variety of adhesive, double-side adhesive tapes or means of physical fixing including anchoring and stitching.

In the embodiment shown, the encapsulated flexible double-switching heater 400 that is bonded to the flooring textile 490 is positioned over an underlay 495 for the flooring textile 490. In alternate embodiments (not shown), the encapsulated flexible double-switching heater 400 may be used as a free-standing floor covering. In other alternate embodiments, the encapsulated flexible double-switching heater 400 may be used in radiant-heated room application by attaching the encapsulated flexible double-switching heater 400 to a decorative wall hanging (e.g. a picture) and/or an apparatus (e.g. a space heater) for projecting radiant heat into the room.

Snow Melting, Anti-Icing and De-Icing.

Figure 5:
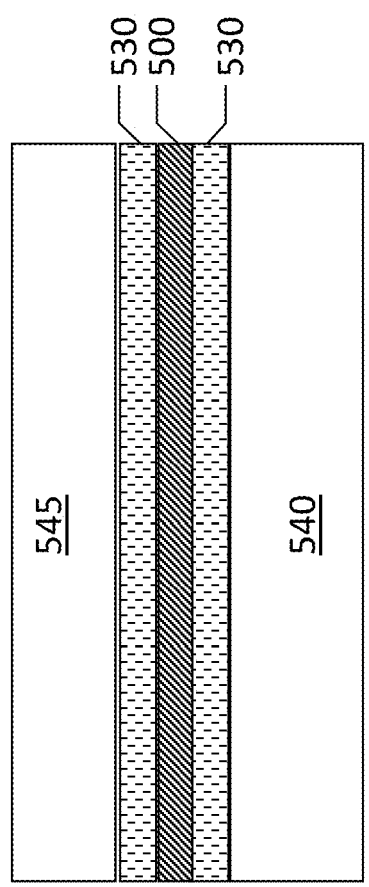
FIG. 5 is a cross sectional view of flexible double-switching heater used in a snow melting, de-icing and/or anti-icing application according to one embodiment of the present invention.

FIG. 5 depicts a flexible double-switching heater used in a snow melting, de-icing and/or anti-icing application. As shown in FIG. 5, the flexible double-switching heater 500 is encapsulated in an encapsulation material 530. Suitable encapsulation materials 530 for this application include but are not limited to rubber, fabric, silicone, polyurethane or other tough polymers.

In some embodiments, encapsulated flexible double-switching heater 500 may comprise its own power supply (not shown). The encapsulated flexible double-switching heater 500 can then be disposed over a sub-surface 540 for snow-melting, de-icing and/or anti-icing applications. Exemplary sub-surfaces 540 include, but are not limited to, door steps, walkways, parking areas (e.g. a driveway), road ways (e.g. tarmacs), carports, semi-trailer tops, vehicle structure (e.g. a car or a boat) or building components (e.g. a deck, ladder, stair, roof or gutter). Depending on the embodiment the sub-surface may be comprised of: concrete, asphalt, sand or gravel.

In the embodiment depicted in FIG. 5, the encapsulated flexible double-switching heater is disposed above a sub-surface 540 but embedded beneath a surface 545. Depending on the embodiment, the surface 545 may be comprised of: a composite protective layer (e.g. rubber).

In alternate embodiments (not shown), the encapsulated flexible double-switching heater 500 can be bonded to a rigid, perforated sheet (e.g. a polymer such as PVC sheet). The sheet comprising the encapsulated flexible double-switching heater 500 can then attached to a surface 540 for example by embedding the sheet in the surface and/or underlaying the surface with the sheet.

Figure 6A:
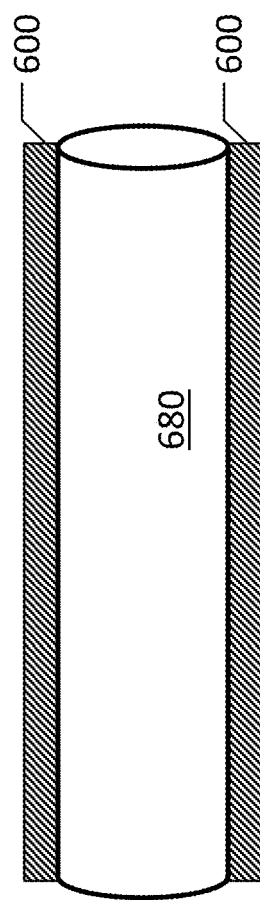
FIG. 6a is a cross sectional view of a flexible double-switching heater used on the exterior of a water pipe in a point-of use water heating application according to one embodiment of the present invention.
Figure 6B:
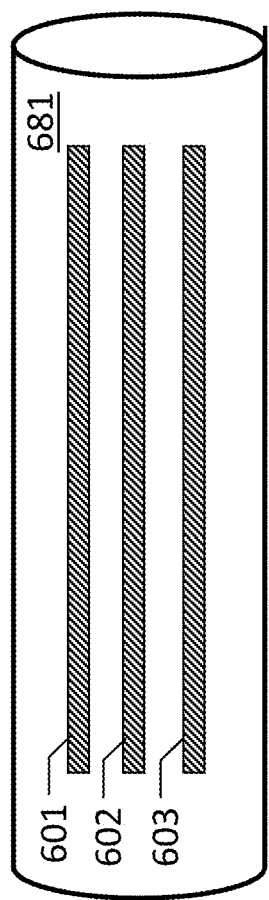
FIG. 6b is a cross sectional view of a flexible double-switching heater used on the interior of a water pipe in a point-of use water heating application according to one embodiment of the present invention.

In another alternate embodiment, the encapsulated flexible double-switching heater 500 can comprise an adhesive layer (not shown) on one of its surfaces. Similarly, the encapsulated flexible double-switching heater 500 may comprise a thermal insulation barrier (not shown) on one of its surfaces. In a specific embodiment, the encapsulated flexible double-switching heater 500 may have an adhesive layer (not shown) on one surface and a thermal insulation barrier (not shown) on the opposite surface. In yet another embodiment, a flexible double-switching heater as described above with adhesive layer on one side and thermal insulation barrier on the opposite side is wrapped on to a water pipe, valve or fitting to prevent freezing, Water-Heating and Other Fluid Applications FIGS. 6a and 6b depict flexible double-switching heaters for use in point-of-use, on-demand and tank form applications. FIG. 6a shows a simple point-of-use water pipe 680 which is wrapped in a flexible double-switching heater 600. The embodiment depicted in FIG. 6a may be used, for example, in a portion of water pipe 680 that is proximal to a faucet, shower head or other dispensing mechanism (not shown).

FIG. 6b shows an alternate embodiment of a water pipe or cavity 681 that has multiple plates comprising flexible double-switching heaters 601, 602, 603 mounted inside the water pipe 681 in a portion of the water pipe 681 that is proximal to a faucet, shower head or other dispensing mechanism (now shown).

Plastics and Metal Molding.

Figure 7:
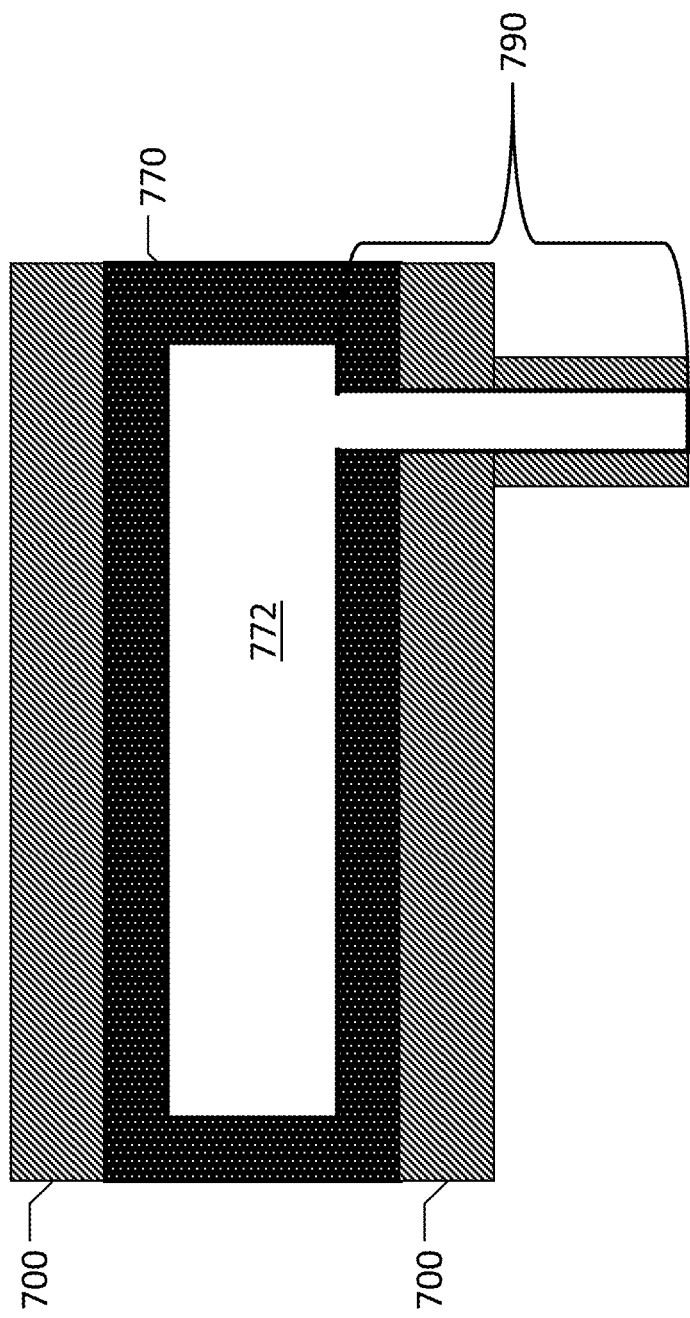
FIG. 7 is a cross sectional view of a double-switching heater used in a molding tool application according to an embodiment of the present invention.

FIG. 7 depicts an application of a flexible double-switching heater in a plastics, rubber, silicone, composite material and metal molding application. Heating molds during part or all of the molding cycle can promote efficient filling of mold cavities, reduced tonnage of injection molding equipment, controlled cooling during solidification of the part, superior optical properties, elimination of autoclaves and ovens and simplification of heating equipment and controls. When applied to the outside surface of very large molds, as for kayaks; or for composite materials molding, as for aircraft or automotive components; or rubber molds, as for automobile tires; or for rotational molds as for plastic storage tubs; flexible double-switching heaters increase productivity by eliminating batch oven processing, allow selective application of heat and in some cases eliminate the use of steam. Other applications are barrels, hot runners, nozzles, mold cavities, sprues and transfer pots for transfer molding; preheaters and mold cavity heaters for compression molding; and extruders and molds for blow molding. Yet other applications are for dies in the casting of metals and the extrusion molding of polymers for components such as films and pipes.

In the embodiment depicted in FIG. 7, a mold 770 comprising a heated hot runner and nozzle 790 has a flexible double-switching heater 700 disposed on the outside of the mold cavity 770. Depending on the embodiment, the mold 770 may be a large mold 700, e.g. 1.5 meters in diameter and 1.5 meters high, or a small mold 770, e.g 2 cm.×2 cm. In addition, in alternate embodiments (not shown), the flexible double-switching heater 700 may be disposed on the inside of the mold 700 provided it is fitted with a suitable overlaying material such as metal foil that is compatible with the physical conditions of temperature, pressure and reaction with the melt.

Residential, Commercial and Cooking Appliances.

Other exemplary applications of flexible double-switching heater include, but not limited to, warming drawers, slow cookers, coffee makers, hot potable water supplies, electric teapots, ice cube trays and steam generators. Other residential applications are bathtubs, refrigerator defrosters, dishwasher vents, towel warmers, toilet seat warmers and dry sauna heaters. As discussed above, depending on the embodiment and the type of materials used in making the flexible double-switching heater, the switching temperature of the first PTC effect can range from 30°–70° C.

Suitable substrates for this application include: polyethylene terephthalate (PET) and polyimide. Depending on the embodiment, the flexible double-switching heaters may be encapsulated with ethylene-vinyl acetate (EVA) and/or acrylics.

Automotive Heating

Flexible double-sided heaters may also be used for automotive applications such as, but not limited to, seat warmers, electric car battery warmers, mirror warmers, steering wheel warmers, and cold weather accessories such as heaters for fuel piping, oil pans, transmission pans, batteries and engine blocks. Suitable substrates for this application include: aluminum, steel, carbon or glass composite, molded plastic, high-density polyethylene (HDPE) and styrene ethylene butylene styrene (SEBS). Depending on the embodiment, the flexible double-switching heaters may be encapsulated with standard polymers such as polyethylene terephthalate (PET), ethylene-vinyl acetate (EVA), acrylics and silicon.

The advantage of using PTC heaters is the elimination of a temperature sensor, elimination of controller or power supply, excellent temperature uniformity and efficiency. The latter advantage arises from the PTC ink being formulated to switch at a desired level.

EXAMPLES

The invention will now be described in more detail with reference to the following examples. However, it should be understood that these examples are given for the purpose of illustration only and are not intended to limit the scope of the present invention.

Compositions for the Examples below are summarized in TABLE 1, where all component concentrations are expressed as percentage by weight based on the total ink composition.

TABLE 1

| Examples | Polymer Resin 1 (wt. %) | Polymer Resin 2 (wt. %) | Carbon black (wt. %) | Solvent (wt. %) | Dispersing additive (wt. %) | Rheology additive (wt. %) |
|---|---|---|---|---|---|---|
| Example 1 | 8.0 | 8.0 | 23.0 | 56.0 | 2.00 | 3.00 |
| Example 2 | 10.0 | 10.0 | 21.0 | 55.0 | 1.50 | 2.50 |
| Example 3 | 12.0 | 12.0 | 19.0 | 54.0 | 1.00 | 2.00 |

Example 1

The PTC ink and film were made following the typical procedure described above. The polymer resin-1, polymer resin-2, carbon black, solvent, dispersing additive, and rheology additive used in this Example, Example 2 and Example 3 are respectively polyethylene glycols (Carbowax 1450 from Dow Chemicals) with a melting point ranging from 42–46° C., polyvinylidene fluoride (PVDF) (Solef460 from Solvay) with a melting point of 155-160° C., carbon black REGAL 350R, NMP, BYK-220S, and BYK-410, and their contents in the PTC compositions are listed in TABLE-1.

Figure 8:
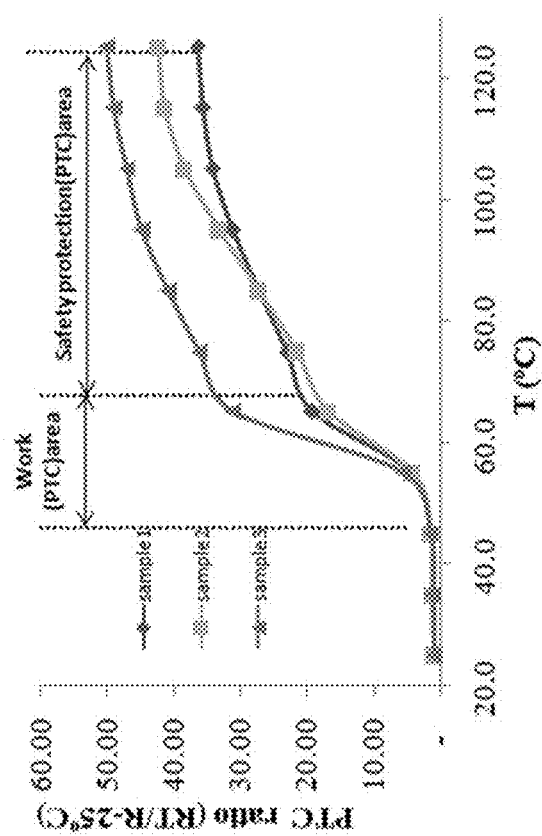
FIG. 8 presents the temperature-resistance curves of the PTC ink discussed in Example 1, Example 2 and Example 3.

In order to test the PTC ink for dispersion and resistivity, the PTC ink compositions of Examples 1, 2 and 3 were screen-printed onto polyester film to produce four strips, each strip having dimensions of approximately 1 cm by 10 cm. Silver contacts were applied to both ends of each strip in order to measure resistance and experimental error. In addition, a 5 cm by 5 cm square was printed to evaluate dispersion and uniformity. The composition of Example 1 yielded resistivity at 25° C. of the PTC film from this example is 3.9 Kohm/sq. FIG. 8 show the temperature-resistance curves of it.

Example 2

The conditions were used as Example 1, but more polymer solution was added into the system. The resistivity at 25° C. of the PTC film from this example is 8.0 Kohm/sq. FIG. 8 shows the temperature-resistance curves generated using this Example.

Example 3

The same conditions were used as Examples 1 and 2, but more polymer solution was added into the system. The resistivity at 25° C. of the PTC film from this example is 15.0 Kohm/sq. FIG. 8 shows the temperature-resistance curves generated using this Example.

As shown in FIG. 8, the PTC ink of the present invention presents good PTC effect, at 60° C., the PTC ratio RT/R-25 is higher than 10, the value of sample 3 is even higher than 20. As the temperature is raised further, no NTC effect appear, it still present good PTC effect, at 120° C., the PTC ratio RT/R-25 is higher than 30, the value of sample 3 is even higher than 50. When the present PTC ink is applied in a self-regulating heating element with low regulated temperatures (<70° C.), the safety risks area is completely eliminated.

Example 4

Figure 9:
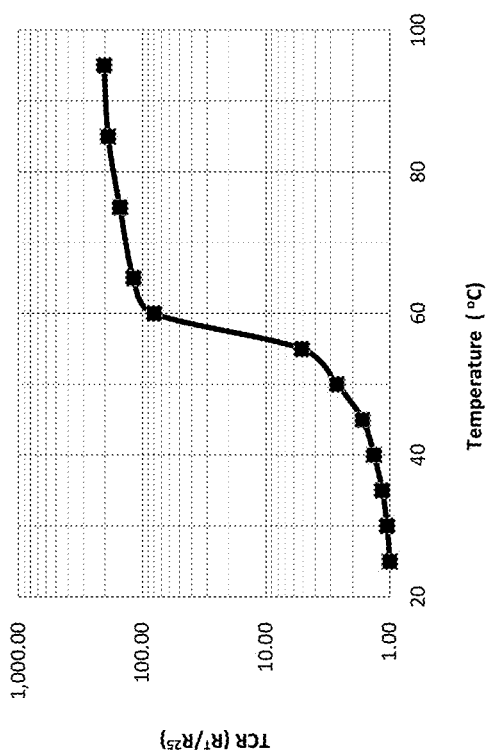
FIG. 9 presents the temperature-resistance curves of the PTC ink discussed in Example 4.

The PTC ink and film were made following the procedure as described in Example 1. Commercially available polymer Elvax 265 (from DuPont) having a softening point of 49° C. was used as the first thermally active polymer resin-1. Another commercially available polymer BR-106 (BR-106, DIANAL resins purchased from Univar Canada Ltd) having a melting point of above 160° C. was used as the thermally active polymer resin-2. Commercially available carbon black Monarch 120 (from Cabot) was used as conductive particle. Commercially available solvent TEP (Triethyl Phosphate from Eastman) having a boiling point of about 209° C. was used as the solvent. BYK-220S, and BYK-410 were used as dispersing additive and rheology additive respectively. The content by weight of each component in the PTC compositions are listed in TABLE-2. The measured sheet resistivity of the PTC film generated using the PTC ink of this example screen printed onto a polyester substrate is 8.0 KΩ/◇ at 25° C., and exhibits the temperature coefficient ratio (TCR) profile illustrated in FIG. 9. The TCR is the ratio between the resistance at a given temperature and the resistance at room temperature (27° C.).

TABLE 2

| Examples | Polymer Resin 1 (wt. %) | Polymer Resin 2 (wt. %) | Carbon black (wt. %) | Solvent (wt. %) | Dispersing additive (wt. %) | Rheology additive (wt. %) |
| --- | --- | --- | --- | --- | --- | --- |
| Example 4 | 8.0 | 18.0 | 18.0 | 52.0 | 2.00 | 2.00 |

Example 5

To further test the PTC film of the present invention, the double-switching PTC ink of Example 4 was printed onto a 500 mm by 500 mm square of polyester film to form 64 (in a configuration of 14×6) PTC heating strips in parallel connection by silver bus lines generated using silver paste (DuPont 5025). Each strip was 2 cm by 4 cm and the strips were placed at intervals of 1 cm. After sequentially printing/drying of PTC ink (Example 4) and silver paste (DuPont 5025), the heating element was laminated with a standard EVA/PET film with copper ribbons embedded on both sides as the electrodes and yielded an overall effective initial resistance of 1.4KΩ at 27° C. 220 V/60 Hz of power was supplied to the electrical electrodes and generated an initial heating power of 34.6 watt, which was equal to a power density of 138.4 watt/m2 at 27° C.

Figure 10:
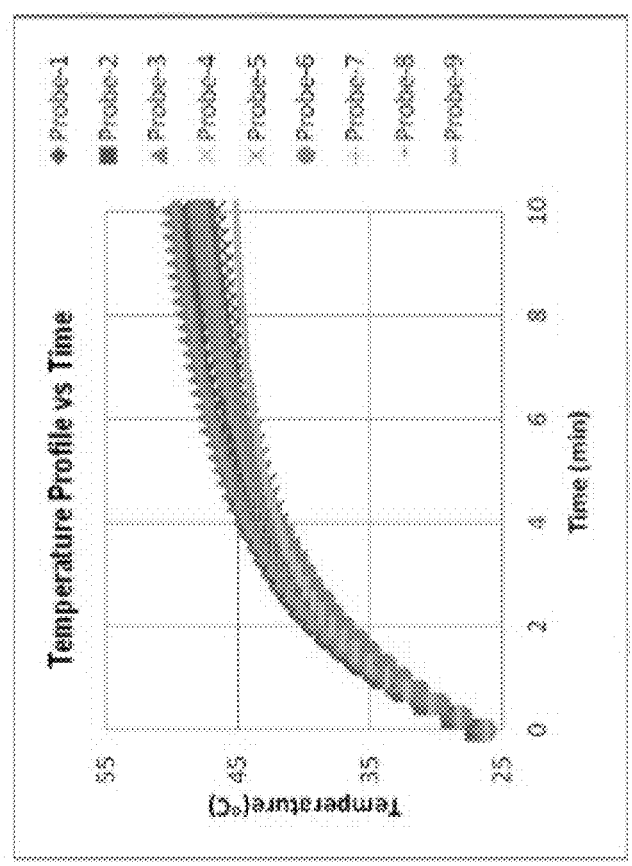
FIG. 10 presents the temperature profiles of a double-switching PTC film during operation.
Figure 11:
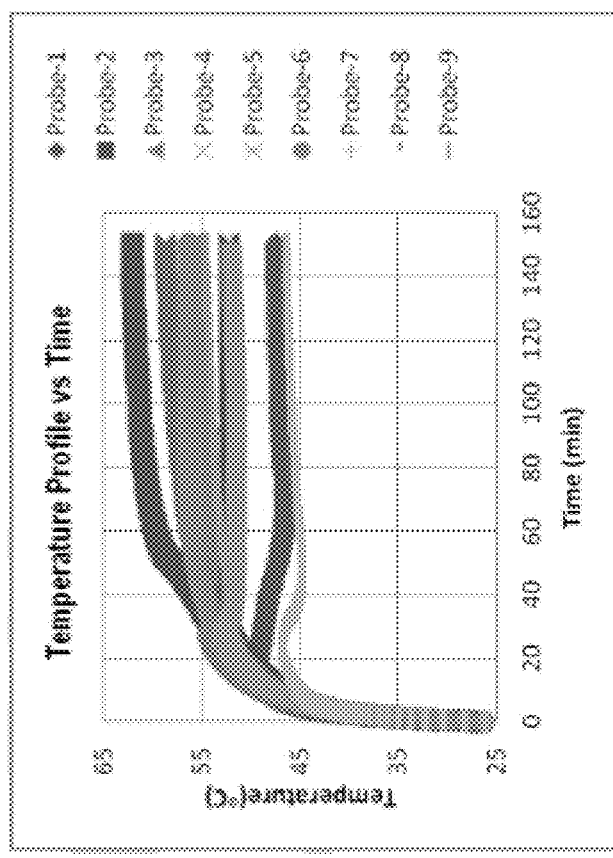
FIG. 11 presents the temperature profiles of a double-switching PTC film during operation.

Nine temperature probes where placed across the heating element at different positions to check the temperature uniformity. To check the self-regulating properties of the double-switching PTC ink, the heating element was placed under a thick blanket to reduce the heat loss to the surrounding environment. FIG. 10 demonstrates the temperature profiles observed over the first ten minutes of operation for each probe. FIG. 11 demonstrates the temperature profiles observed over the first 150 minutes of operation. As shown in FIGS. 10 and 11, there is some variance in temperature profiles due to the probe's position variation and heat loss associated therewith, i.e., the heat loss was more at the outer edges than at the center. However, both Figures demonstrate that the all of the temperature profiles reach an equilibrium after approximately 60 minutes.

Figure 12:
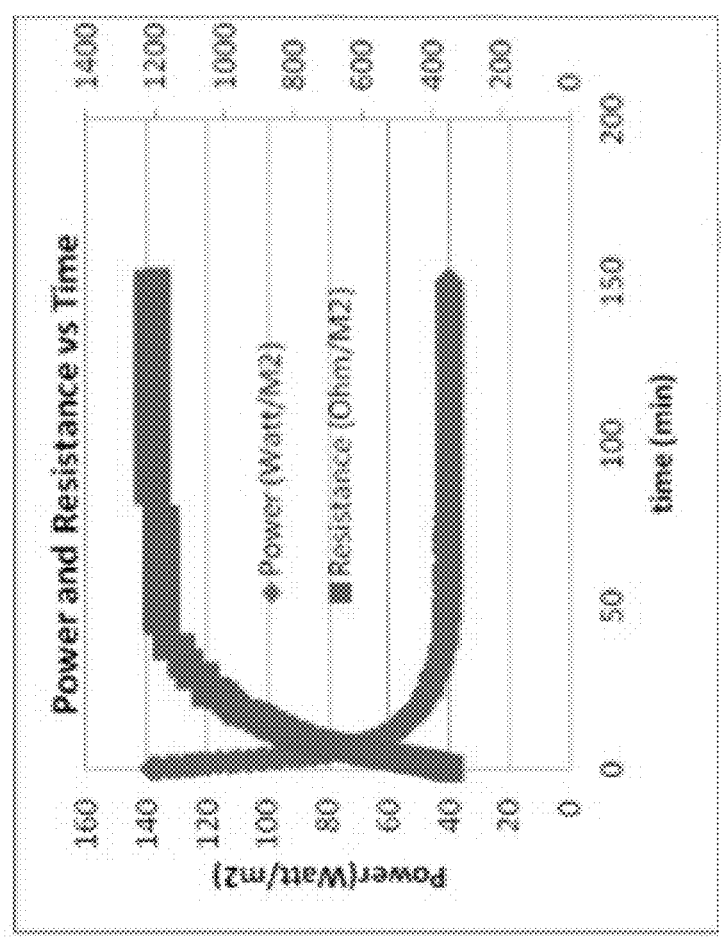
FIG. 12 presents PTC profile of a double-switching PTC film.
Figure 13:
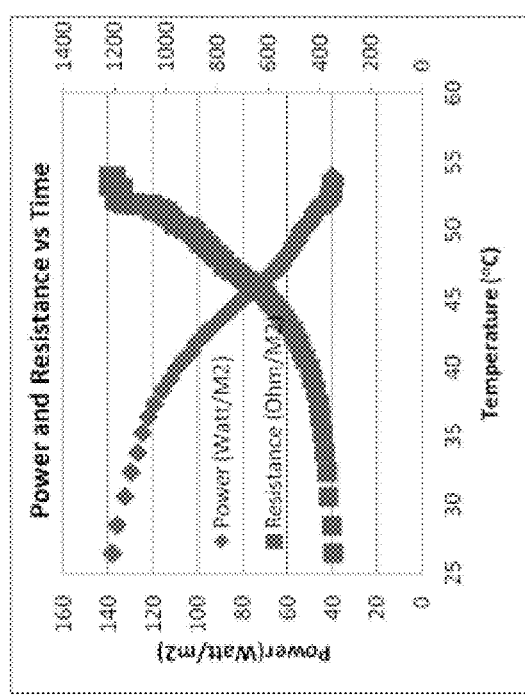
FIG. 13 presents the PTC profile of a double-switching PTC film.
Figure 14:
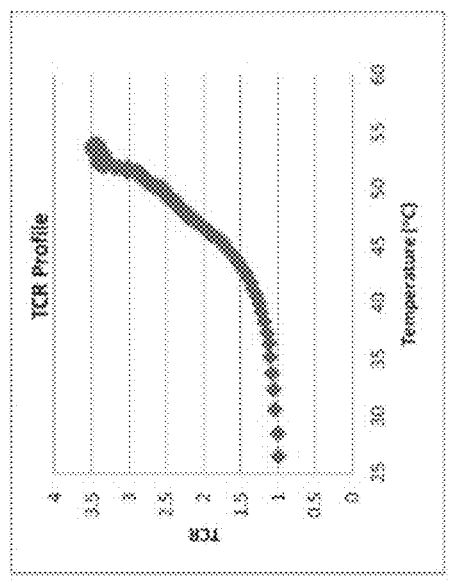
FIG. 14 presents the TCR profile of a double-switching PTC film.

In addition, the resistance of the various strips was measured with varying voltages to produce the PTC profiles shown in FIGS. 12 and 13. FIG. 14 includes the Temperature Co-efficiency Ratio (TCR) measured over varying temperatures. The TCR is the ratio between the resistance at a given temperature and the resistance at room temperature (27° C.).

Example 6

To examine the durability of a flexible double-switching heater made using a double-switching PTC ink of the present invention, a flexible double-switching heater was made by printing the double-switching PTC ink of Example 4 onto a polyester substrate. Electrical components were made by disposing silver paste (DuPont 5025) onto the substrate after the ink was cured. A reference sample was generated using the same technique but substituting a commercially available PTC ink (DuPont 7282) for the ink of the present invention.

To measure resistance strips of 1×10 cm dimensions of both the double-switching PTC ink and the reference PTC ink were printed onto the substrate and subject to 25 operating cycles. During each operation cycle, the strips were heated to 65° C. at a relative humidity of 60% for 24 hours then allowed to cool to room temperature (27° C. at a relative humidity of 40%) for 24 hours. Resistance was measured at the end of each operating cycle (i.e. following the 24-hour period at room temperature). For the experimental and reference sample, the relative resistance of each sample was calculated by dividing the resistance obtained at each operating cycle by the initial measured resistance.

Figure 15:
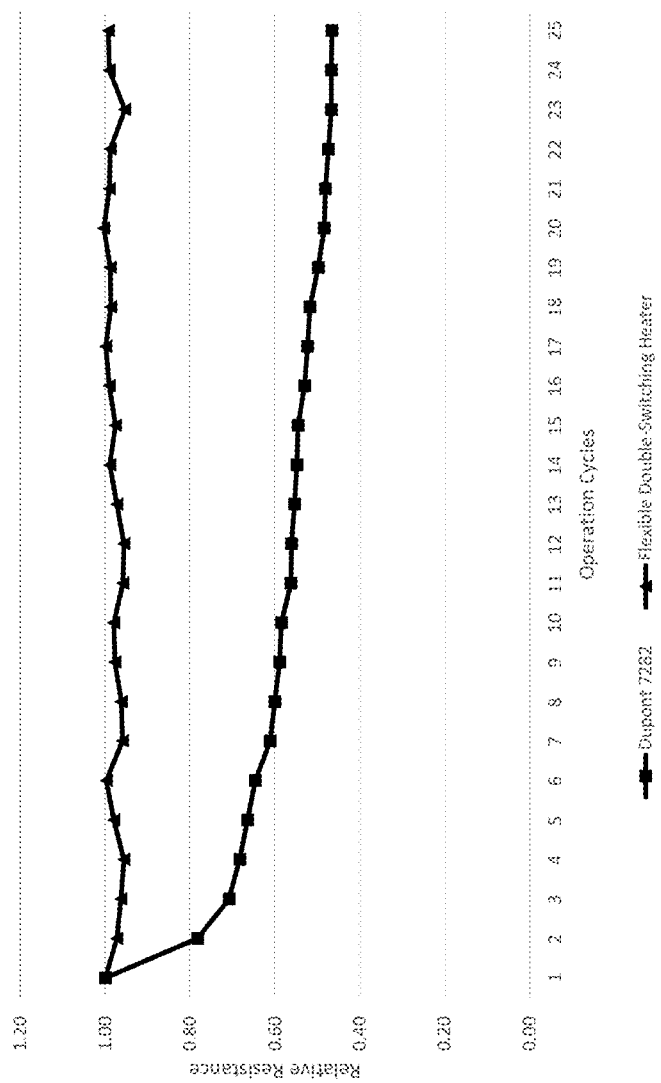
FIG. 15 presents the relative resistance of a double-switching PTC film plotted relative to a control sample.

FIG. 15 shows the relative resistance for both samples measured over the 25 operating cycles. As shown in FIG. 15, the relative resistance of the double-switching PTC ink of the present invention suffers only slight degradation due to the elimination of NTC effect obtained by the second PTC effect. Conversely, the reference sample with conventional PTC ink had diminished relative resistance over time, suggesting an NTC effect had caused material degradation.

Further Applications: Body Warming/Pain Relief

A flexible double-switching heater comprising a double-switching PTC ink deposited on a flexible substrate may also be used as an article for body warming and/or pain relief applications such as, but not limited to, heating pads, heat wraps, heated blankets, heated throws, heated body pillows and heated mattress pads. The double-switching PTC ink has a first resin that provides a first PTC effect at a first temperature range and a second resin that provides a second PTC effect at a second temperature range, wherein the second temperature range is higher than the first temperature range. In some embodiments, the first temperature range is between 30 C-70 C. Suitable substrates for this application are low-weight and flexible, and can include for example, thermoplastic polyurethane (TPU) or fabric itself such as polyester blend or nylon.

The advantage of using PTC heaters is the elimination of a temperature sensor, elimination of controller or power supply, elimination of physical connectors (e.g. wires), excellent temperature uniformity and efficiency. The latter advantage arises from the PTC ink being formulated to switch at a desired level, as well as the layout/design of the article. In addition, the article can achieve heating temperatures with lower voltage. In addition, the article can be laundered.

Figure 16:
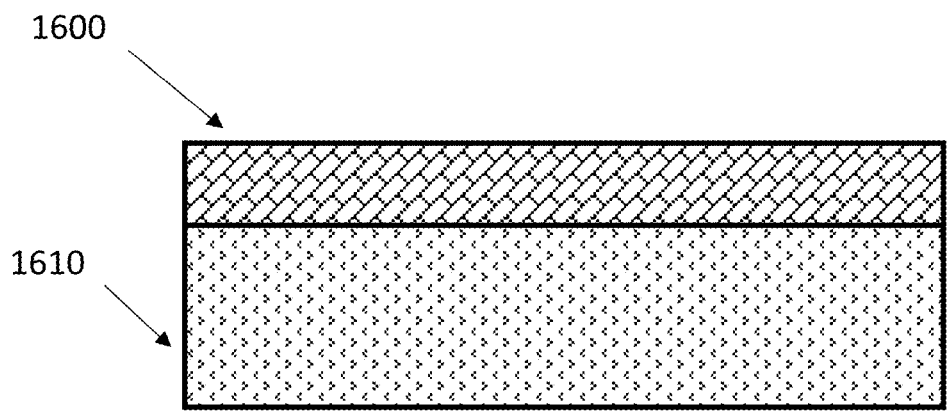
FIG. 16 is a cross sectional view of a double-switching heater used in a body warming/pain relief application according to an embodiment of the present invention.
Figure 17:
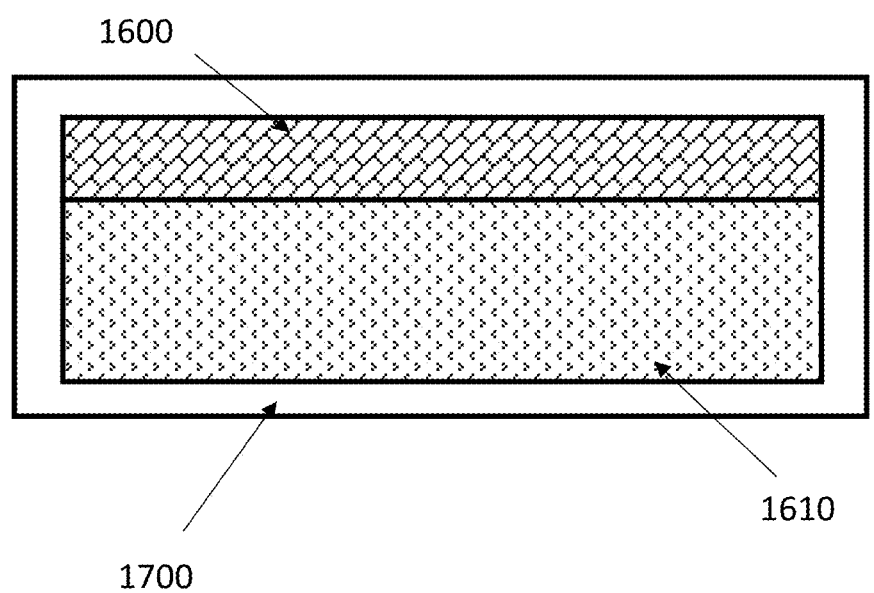
FIG. 17 is a cross sectional view of a double-switching heater used in a body warming/pain relief application according to an embodiment of the present invention.

In some embodiments, the double-switching PTC ink 1600 is deposited onto a TPU substrate 1610 using a method of screen printing, as shown in FIG. 16. In some embodiments, the double-switching PTC ink/TPU substrate assembly (i.e. the double-switching flexible heater) is cured using heat, and then encapsulated in an encapsulation material 1700, as shown in FIG. 17. Suitable encapsulation materials for use in this application include a dielectric ink or other thin film. In some embodiments, the encapsulated heater is inserted, sewn or otherwise attached to a fabric or shell (that is placed adjacent to a user) to form the article for body warming and/or pain relief.

Figure 18:
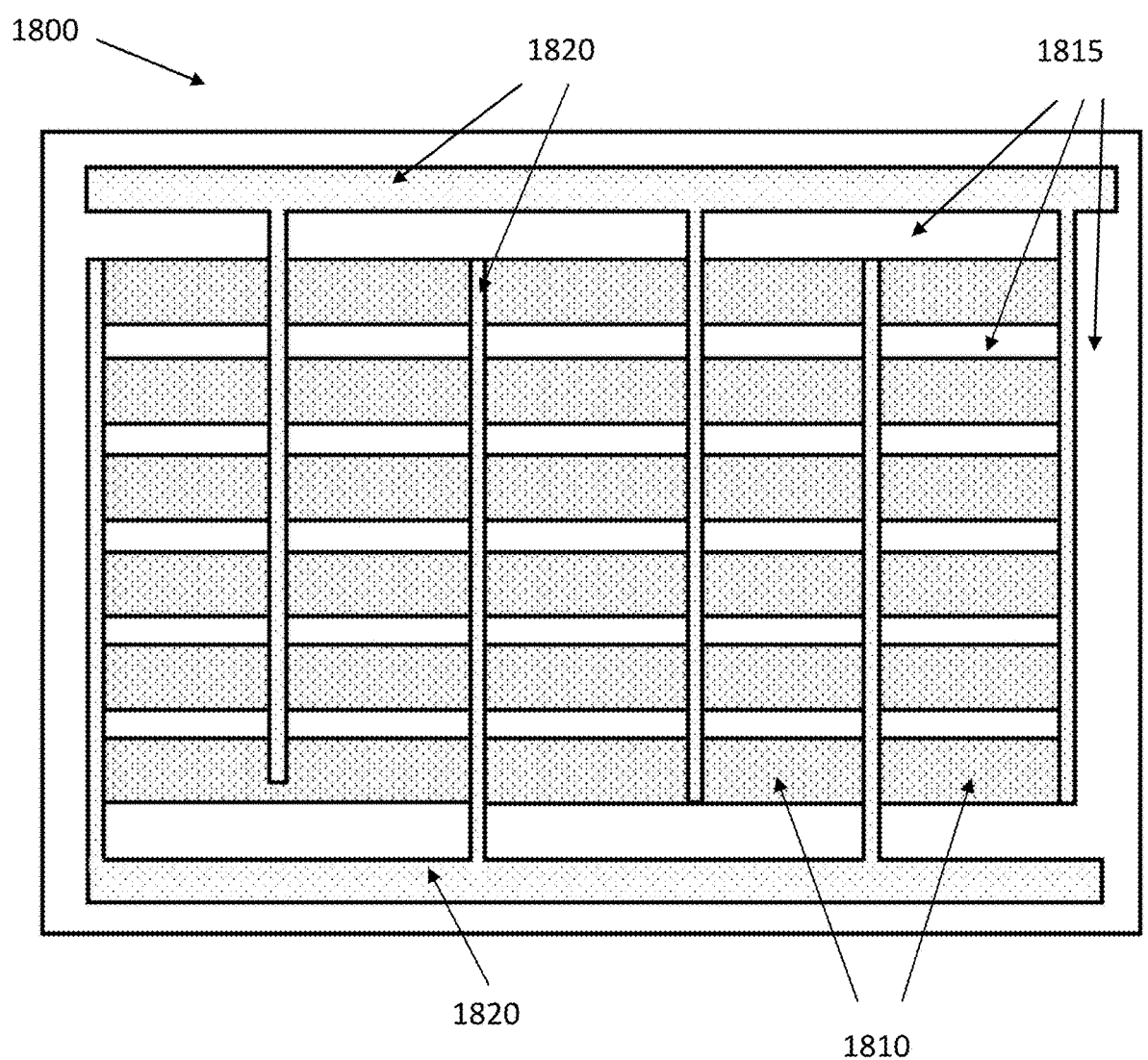
FIG. 18 is a plan view of a double-switching heater used in a body warming/pain relief application according to an embodiment of the present invention.

FIG. 18 is a plan view of a double-switching heater used in a body warming/pain relief application according to an embodiment of the present invention. FIG. 18 illustrates a thin film panel 1800 comprising a double-switching PTC ink 1810 screen printed onto a TPU substrate 1815, cured with heat, and encapsulated with a dielectric ink (not shown). Panel 1800 also comprises a series of printed conductive traces 1820 that are screen printed onto the TPU, cured, and laminated with a dielectric ink. The conductive traces 1820 are designed to carry the electrical current. In FIG. 18, the conductive traces 1820 run perpendicular through the printed double-switching PTC ink, which creates a plurality of individual resistors 1810 that generate heat. Each individual resistor is also self-regulating due to the properties of the double-switching PTC ink properties, which relates to the ability of each individual resistor resisting the electrical current enough to prevent overheating, fires and failures. In some embodiments, printed silver traces are used.

In one example of body warming/pain relief application, a double-switching PTC ink was deposited onto a TPU substrate using a method of screen printing. A voltage of 120VAC was applied to the article, resulting in a watt density of between 5-10 watts/ft$^2$, or around 7 watts/ft$^2$. While the article can be any shape, in this example, it was square or rectangular. The square measured from 6 in×6 in to 24 in×24 in, or about 12 in×12 in. The rectangle measured from 6 in×12 in to 18 in×30 in, or about 12 in×24 in. The self-regulating temperature of the double-switching ink was about 60 C, while the temperature of the article where applied to a user was about 50 C to about 55 C or about 52 C. In general, an article can be designed to obtain a range of self-regulating temperatures and watt densities, in order to achieve specific metrics required by a customer.

In a second example of body warming/pain relief application, a double-switching PTC ink is deposited onto a TPU substrate using a method of screen printing. A voltage of about 11.1 VDC was applied to the article, resulting in a watt density of between 60-70 watts/ft$^2$, or about 65 watts/ft$^2$. While the article can be any shape, in this example, it was square, measuring from 6 in×6 in to 24 in×24 in, or about 12 in×12 in. The self-regulating temperature of the double-switching PTC ink was about 73 C, while the temperature of the article where applied to a user was about 60 C to about 70 C or about 65 C. In general, an article can be designed to obtain a range of self-regulating temperatures and watt densities, in order to achieve specific metrics required by a customer.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of an invention as defined in the appended claims.

The invention claimed is:

1. An article comprising a double-switching heater, the double-switching heater comprising:
    a double-switching PTC ink deposited on a flexible substrate to form one or more resistors, the double-switching PTC ink comprising a first resin and a second resin, wherein:
    the substrate is either thermal polyurethane, nylon or a polyester blend;
    the first resin provides a first PTC effect within a first temperature range (T1, T2);
    the second resin provides a second PTC effect within a second temperature range (T3, T4), where T3≥T2;
    the first resin has an NTC effect above the first temperature range;
    the second PTC effect is greater than the first PTC effect; and
    the second PTC effect overlaps with, and is greater than, the NTC effect of the first resin.

2. The article of claim 1, wherein the substrate is thermal polyurethane.

3. The article of claim 1, wherein the double-switching PTC ink is screen printed onto the substrate.

4. The article of claim 1, wherein the double-switching heater is encapsulated by a dielectric ink or a thin film.

5. The article of claim 4, wherein the double-switching heater is encapsulated by a dielectric ink.

6. The article of claim 1, wherein the double-switching heater further comprises a plurality of conductive traces.

7. The article of claim 6, wherein the plurality of conductive traces are laminated with a dielectric ink.

8. The article of claim 6, wherein the plurality of conductive traces are each silver traces.

9. The article of claim 1, wherein: the first resin is crystalline or semi-crystalline; and the second resin is non-crystalline.

10. The article of claim 1, wherein a switching temperature of the double-switching heater is between 30° C. and 160° C.

11. The article of claim 1, wherein:
    the second resin is selected from the group consisting of: polyvinylidene fluoride, polyvinyl chloride, high-density polyethylene, and polyacrylate compounds and the second temperature range is from 70° C. to 160° C.; and/or
    the first resin is selected from:
    the group consisting of: polyethylene glycol and polycaprolactone and the first temperature range is from 20° C. to 35° C.; or the group consisting of: polycaprolactone diol and ethylene-vinyl acetate copolymer and the first temperature range is from 36° C. to 50° C.; or the group consisting of: low-density polyethylene and maleic acid grafted polyvinyl chloride and the first temperature range is from 51° C. to 70° C.

12. The article of claim 1, wherein the article is a heating pad, a heat wrap, a heated blanket, a heated throw, a heated body pillow or a heated mattress pad.

13. A panel comprising an encapsulated double-switching heater, the double-switching heater comprising a double-switching PTC ink deposited on a flexible substrate to form one or more resistors, the double-switching PTC ink comprising a first resin and a second resin, wherein:
the substrate is thermal polyurethane;
the first resin provides a first PTC effect within a first temperature range (T1, T2);
the second resin provides a second PTC effect within a second temperature range (T3, T4), where T3≥T2;
the first resin has an NTC effect above the first temperature range;
the second PTC effect is greater than the first PTC effect;
the second PTC effect overlaps with, and is greater than, the NTC effect of the first resin; and
the double-switching heater is encapsulated in a dielectric ink.

14. The panel of claim 13, wherein the double-switching PTC ink is screen printed onto the substrate.

15. The panel of claim 13, wherein the encapsulated double-switching heater further comprises a plurality of conductive traces.

16. The panel of claim 15, wherein the plurality of conductive traces are laminated with a dielectric ink.

17. The panel of claim 15, wherein the plurality of conductive traces are each silver traces.

18. The panel of claim 13, wherein: the first resin is crystalline or semi-crystalline; and the second resin is non-crystalline.

19. The panel of claim 13, wherein a switching temperature of the double-switching heater is between 30° C. and 160° C.

20. The panel of claim 13, wherein:
the second resin is selected from the group consisting of: polyvinylidene fluoride, polyvinyl chloride, high-density polyethylene, and polyacrylate compounds and the second temperature range is from 70° C. to 160° C.; and/or
the first resin is selected from:
the group consisting of: polyethylene glycol and polycaprolactone and the first temperature range is from 20° C. to 35° C.; or
the group consisting of: polycaprolactone diol and ethylene-vinyl acetate copolymer and the first temperature range is from 36° C. to 50° C.; or
the group consisting of: low-density polyethylene and maleic acid grafted polyvinyl chloride and the first temperature range is from 51° C. to 70° C.

\* \* \* \* \*